(12) United States Patent
Liu et al.

(10) Patent No.: US 10,866,679 B2
(45) Date of Patent: Dec. 15, 2020

(54) DISPLAY PANEL, DISPLAY DEVICE, AND PRESSURE DETECTING METHOD

(71) Applicants: Beijing BOE Optoelectronics Technology Co., Ltd., Beijing (CN); BOE Technology Group Co., Ltd., Beijing (CN)

(72) Inventors: Yujie Liu, Beijing (CN); Yingxue Yu, Beijing (CN); Tingting Zhao, Beijing (CN); Meiling Jin, Beijing (CN); Jian Zhang, Beijing (CN); Liangliang Li, Beijing (CN); Jinzhao Zhou, Beijing (CN); Lulu Li, Beijing (CN); Cai Zheng, Beijing (CN); Qin Xin, Beijing (CN); Yahui Niu, Beijing (CN); Zhiqiang Zhang, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/701,222

(22) Filed: Dec. 3, 2019

(65) Prior Publication Data
US 2020/0285344 A1 Sep. 10, 2020

(30) Foreign Application Priority Data
Mar. 7, 2019 (CN) .......................... 2019 1 0170464

(51) Int. Cl.
*G06F 3/042* (2006.01)
*H01L 27/32* (2006.01)
(Continued)

(52) U.S. Cl.
CPC .......... *G06F 3/0421* (2013.01); *G06F 3/0412* (2013.01); *H01L 27/307* (2013.01);
(Continued)

(58) Field of Classification Search
CPC ... G06F 3/0421; G06F 3/0412; H01L 27/307; H01L 27/323; H01L 27/3234;
(Continued)

(56) References Cited

U.S. PATENT DOCUMENTS 9,830,020 B2 * 11/2017 Xiao .................... G06F 3/0421

\* cited by examiner

*Primary Examiner* — Stacy Khoo
(74) *Attorney, Agent, or Firm* — Arent Fox LLP; Michael Fainberg

(57) ABSTRACT

A display panel, a display device, and a pressure detecting method. The display panel includes: a first substrate, a plurality of light-emitting elements spaced with each other on one side of the first substrate, a plurality of photosensitive detecting elements, and elastic light-reflecting components arranged on a light-emitting side of the light-emitting elements, an orthographical projection of the photosensitive detecting elements on the first substrate is in an orthographical projection of the light-emitting elements on the first substrate; and the elastic light-reflecting components is configured to be deformed by pressing so that areas of orthographical projection thereof on the first substrate become larger to thereby change an amount of light emitted by the light-emitting elements, and reflected by the elastic light-reflecting components to the photosensitive detecting elements.

19 Claims, 4 Drawing Sheets

(51) Int. Cl.
*H01L 51/44* (2006.01)
*H01L 51/00* (2006.01)
*H01L 51/52* (2006.01)
*H01L 27/30* (2006.01)
*G06F 3/041* (2006.01)

(52) U.S. Cl.
CPC ........ *H01L 27/323* (2013.01); *H01L 27/3234* (2013.01); *H01L 27/3272* (2013.01); *H01L 51/0097* (2013.01); *H01L 51/447* (2013.01); *H01L 51/5281* (2013.01); *H01L 2251/5338* (2013.01)

(58) Field of Classification Search
CPC ............. H01L 27/3272; H01L 51/0097; H01L 51/5281; H01L 2251/5338; G01L 51/447
See application file for complete search history.

DISPLAY PANEL, DISPLAY DEVICE, AND PRESSURE DETECTING METHOD

CROSS-REFERENCE TO RELATED APPLICATION

This application claims priority of Chinese Patent Application No. 201910170464.X, filed on Mar. 7, 2019, which is hereby incorporated by reference in its entirety.

FIELD

The present disclosure relates to the field of semiconductor technologies, and particularly to a display panel, a display device, and a pressure detecting method.

BACKGROUND

Touch screen panel has become the existing most convenient electronic devices for human-machine interaction, is integrated with a touch function and a display function, and can be widely applicable to the existing portable electronic devices, e.g., a smart mobile phone, a tablet computer, a notebook computer, etc. A two-dimension position of a touch point on the touch panels including a capacitive or resistive screen is determined. As the technologies are advancing rapidly, in order to provide a greater diversity of human-machine interaction, and to further improve an experience of human-machine interaction, a part of the existing touch panels are provided with a pressure sensing function. A touch panel with a pressure sensing function is also referred to as a pressure sensing touch panel, and can sense a touching pressure in addition to the position of the touch point so that a corresponding function can be enabled, or an image can be displayed, according to the position of the touch point, and the touching pressure, thus extending the touch technologies to the field of 3D displays.

A pressure sensor in the existing touch screen panel is generally a capacitive pressure sensor including an electrode which is a round thin film of metal or plated with metal, where when the thin film is pressed and deformed, the capacitance of a capacitor formed between the thin film and a fixed electrode is changed so that a voltage-dependent electrical signal can be output by a measuring circuit. The touch function of the touch panel is self- or mutual-capacitive, and touch information is recognized by changing a change in capacitance.

SUMMARY

An embodiment of the disclosure provides a first substrate, a plurality of light-emitting elements spaced with each other on one side of the first substrate, a plurality of photosensitive detecting elements, and elastic light-reflecting components arranged on a light-emitting side of the light-emitting elements, wherein:

an orthographical projection of the photosensitive detecting elements on the first substrate is in an orthographical projection of the light-emitting elements on the first substrate; and the elastic light-reflecting components is configured to be deformed by pressing so that areas of orthographical projection thereof on the first substrate become larger to thereby change an amount of light emitted by the light-emitting elements, and reflected by the elastic light-reflecting components to the photosensitive detecting elements.

In a possible implementation, the orthographical projection of the elastic light-reflecting components on the first substrate covers the orthographical projection of the light-emitting elements on the first substrate, upon the elastic light-reflecting being deformed by pressing.

In a possible implementation, the elastic light-reflecting components includes an elastic body, and reflecting particles dispersed in the elastic body, and the reflecting particles are configured to totally reflect the light incident on the elastic light-reflecting component.

In a possible implementation, a material of the elastic body is dimethylsiloxane.

In a possible implementation, a material of the reflecting particles is titanium dioxide.

In a possible implementation, surfaces of the elastic light-reflecting components facing the photosensitive detecting elements are concave-convex surfaces.

In a possible implementation, the display panel further includes gaps arranged between adjacent elastic light-reflecting components.

In a possible implementation, the display panel further includes light-shielding layers, the elastic light-reflecting components are located between the light-shielding layers and the photosensitive detecting elements, and an orthographical projection of the light-shielding layers on the first substrate cover the orthographical projection of the photosensitive detecting elements on the first substrate.

In a possible implementation, the light-shielding layers are black matrixes.

In a possible implementation, the display panel further includes a second substrate opposite to the first substrate, and the light-shielding layers are located on a side of the second substrate away from the elastic light-reflecting components.

In a possible implementation, the display panel further includes a circularly polarizing sheet located on sides of the light-shielding layers away from the second substrate, and the circularly polarizing sheet is fit on the light-shielding layers through an optical adhesive layer.

In a possible implementation, the elastic light-reflecting components are arranged on a side of the first substrate away from the light-emitting elements, and the light exit faces of the light-emitting elements face the first substrate.

In a possible implementation, the light-emitting elements and the elastic light-reflecting components are arranged on a same side of the first substrate, and the light exit faces of the light-emitting elements is away from the first substrate.

In a possible implementation, the photosensitive detecting elements include an anode, a donor layer, an acceptor layer, and a cathode arranged in a stack, and a light absorption band of the donor layer and/or the acceptor layer is identical to a light emission band of the light-emitting element of the pixel element.

In a possible implementation, the light-emitting elements and the photosensitive detecting elements share a same pixel driving circuit; wherein the pixel driving circuit includes a first transistor, a second transistor, and a third transistor, wherein the first transistor has a gate connected with a gate line, a first electrode connected with a data line, and a second electrode connected with a gate of the second transistor; the second transistor has a first electrode connected with a power supply terminal, and a second electrode connected with one terminal of the light-emitting elements, and the other terminal of the light-emitting elements is grounded; the photosensitive detecting elements have an anode connected with the power supply terminal, and a cathode connected with a gate of the third transistor.

In a possible implementation, a resistor is connected between the second electrode of the third transistor, and the output signal terminal.

An embodiment of the disclosure further provides a display device including the display panel according to any one of the implementations above.

An embodiment of the disclosure further provides a pressure detecting method for detecting a pressure on the display panel according to any one of the implementations above upon being pressed, the method including:

detecting by the photosensitive detecting elements, an amount of light emitted by the light-emitting elements and reflected by the elastic light-reflecting components to the photosensitive detecting elements due to pressing the elastic light-reflecting components; and determining a pressure applied to the display panel according to detected amount of light.

DETAILED DESCRIPTION OF THE EMBODIMENTS

In order to make the objects, technical solutions, and advantages of the disclosure more apparent, the technical solutions according to some embodiments of the disclosure will be described below clearly and fully with reference to the drawings in the embodiments of the disclosure. Apparently the embodiments to be described are only a part but not all of the embodiments of the disclosure. Based upon the embodiments here of the disclosure, all the other embodiments which can occur to those ordinarily skilled in the art without any inventive effort shall come into the scope of the disclosure as claimed.

Unless defined otherwise, technical terms or scientific terms throughout the disclosure shall convey their usual meaning as appreciated by those ordinarily skilled in the art to which the disclosure pertains. The terms "first", "second", or the like throughout the disclosure do not suggest any order, number or significance, but is only intended to distinguish different components from each other. Alike the terms "include", "comprise", or the like refer to that an element or an item preceding to the term encompasses an element(s) or an item(s) succeeding to the term, and its (or their) equivalence(s), but shall not preclude another element(s) or item(s). The term "connect", "connected", or the like does not suggest physical or mechanical connection, but may include electrical connection no matter whether it is direct or indirect. The terms "above", "below", "left", "right", etc., are only intended to represent a relative positional relationship, and when the absolute position of an object as described is changed, the relative positional relationship may also be changed accordingly.

In order to for a clear and concise description below of the embodiments of the disclosure, a detailed description of known functions and components will be omitted in the description.

Figure 1:
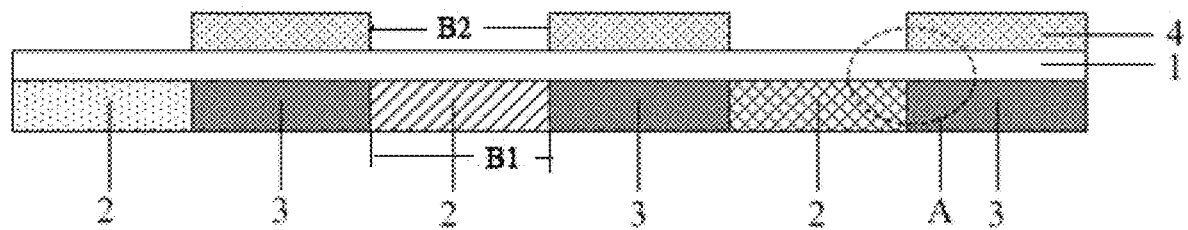
FIG. 1 is a schematic structural diagram of a display panel according to an embodiment of the disclosure.

As illustrated in FIG. 1, an embodiment of the disclosure provides a display panel including: a first substrate 1, a plurality of light-emitting elements 2 spaced with each other on one side of the first substrate 1 (a lower side thereof as illustrated in FIG. 1), a plurality of photosensitive detecting elements 3 arranged in spacing areas B1 between the corresponding light-emitting elements 2, and elastic light-reflecting components 4 arranged corresponding to photosensitive faces of the photosensitive detecting elements 3.

An orthographical projection of a photosensitive detecting element 3, on the first substrate 1 is in an orthographical projection of a spacing area B1, on the first substrate 1. Light exit faces of the light-emitting elements 2, and the photosensitive faces of the photosensitive detecting elements 3 face the same side of the display panel.

Figure 2:
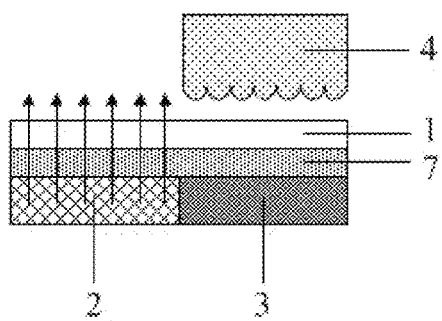
FIG. 2 is a schematic structural diagram of a magnified part of the display panel according to the embodiment of the disclosure, which is not pressed.

The elastic light-reflecting components 4 can be pressed and deformed so that the areas of orthographical projections thereof on the first substrate 1 become larger to thereby change the amount of light emitted by the light-emitting elements 2, and reflected by the elastic light-reflecting components to the photosensitive detecting elements 3. As illustrated in FIG. 2, initially the orthographical projections of the elastic light-reflecting components 4 on the first substrate 1 can be covered with orthographical projections of the photosensitive detecting elements 3 on the first substrate 1, that is, initially the areas of the elastic light-reflecting components 4 are smaller than or equal to the areas of the photosensitive detecting elements 3 to thereby avoid the light emitted by the light-emitting elements 2 from being incident on the photosensitive detecting elements 3 when there is no touch; and when the elastic light-reflecting components 4 are pressed and deformed, the orthographical projections thereof on the first substrate 1 cover a part of the light-emitting elements 2 adjacent to the corresponding photosensitive detecting elements 3 so that the light emitted by the covered part of the light-emitting elements 2 is reflected to the photosensitive detecting elements 3 as illustrated in FIG. 3, where FIG. 2 and FIG. 3 are schematic structural diagrams of the magnified part denoted as A in FIG. 1.

The display panel according to some embodiments of the disclosure includes: the plurality of light-emitting elements 2 located on the first substrate 1, the plurality of photosensitive detecting elements 3 arranged in the spacing areas B1 between the corresponding light-emitting elements 2, and the elastic light-reflecting components 4 arranged corresponding to the photosensitive faces of the respective photosensitive detecting elements 3, where the elastic light-reflecting components 4 can be deformed upon being pressed so that the areas of the orthographical projections thereof on the first substrate become larger, and particularly the orthographical projections thereof on the first substrate 1 can cover a part of the light-emitting elements 2 adjacent to the corresponding photosensitive detecting elements 3 to thereby change the amount of light emitted by the light-emitting elements 2, and reflected by the elastic light-reflecting components to the photosensitive detecting elements 3, that is, the elastic light-reflecting components 4 can reflect the light emitted by the light-emitting elements 2 adjacent thereto upon being pressed, and the reflected light can be detected by the photosensitive detecting elements 3 to thereby detect the pressure by detecting an optical signal so as to avoid the problem in the prior art if a 3D touch screen panel is fabricated using a capacitive pressure sensor, then a real change in touch capacitance of the touch panel may be easily affected, thus degrading the detection sensitivity of the touch panel.

Figure 4:
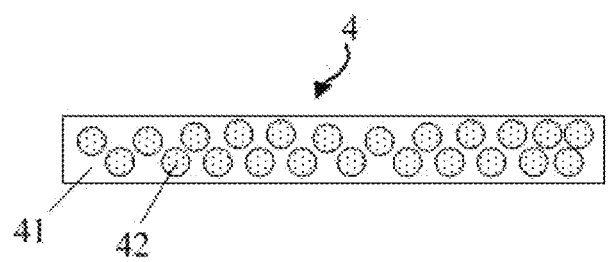
FIG. 4 is a schematic structural diagram of an elastic light-emitting component according to an embodiment of the disclosure.

In a particular implementation, as illustrated in FIG. 4, each elastic light-reflecting component 4 in some embodiments of the disclosure particularly can include an elastic body 41, and reflecting particles 42 dispersed in the elastic body 41, where the reflecting particles 42 are configured to totally reflect the light incident on the elastic light-reflecting component 4. In some embodiments of the disclosure, the elastic light-reflecting component 4 can be made of a material with a high reflectivity, so that when the light is incident on the elastic light-reflecting component 4 from outside the elastic light-reflecting component 4, the elastic light-reflecting component 4 can totally reflect the light to thereby reflect the light emitted by the light-emitting element 2. The material of the elastic body 41 can be dimethylsiloxane with elastic groups, where it can have an elastic modulus of 2.25 Mpa, and a Poisson's ratio of 0.46, that is, the ratio of a traverse deformation to a deformation in an extrusion direction is 0.46, which means good elastic deformation performance, thus facilitating a deformation; and the material of the reflecting particles 42 particularly can be titanium dioxide with a high reflectivity for reflecting incident light from the outside. Optionally, the reflecting particles are uniformly distributed in the elastic base 41.

Figure 3:
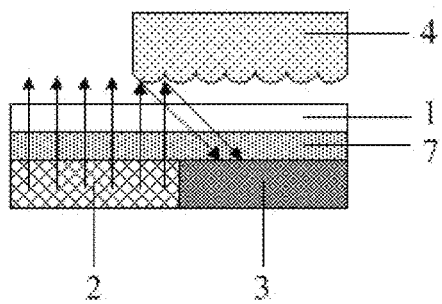
FIG. 3 is a schematic structural diagram of a magnified part of the display panel according to some embodiments of the disclosure, which is pressed.

In a particular implementation, as illustrated in FIG. 2 and FIG. 3, in some embodiments of the disclosure, the surface of the elastic light-reflecting component 4 facing the photosensitive detecting element 3 is a concave-convex surface, so that the propagation direction of the light can be changed when the elastic light-reflecting component is deformed. Particularly the surface of the elastic light-reflecting component 4 facing the photosensitive detecting element 3 can be wavy.

In a particular implementation, as illustrated in FIG. 1, in some embodiments of the disclosure, there are gaps B2 arranged between the adjacent elastic light-reflecting components 4, so that even if the elastic light-reflecting components 4 are blocked by other structures, then they will be deformed upon being pressed.

Figure 5:
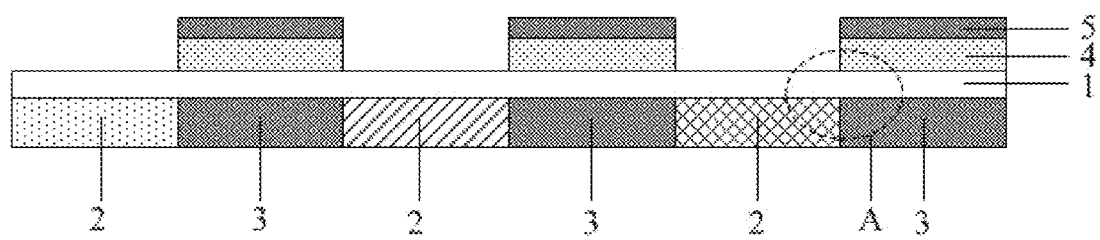
FIG. 5 is a schematic structural diagram of the display panel according to some embodiments of the disclosure, which is arranged with a light-shielding layer.

In a particular implementation, as illustrated in FIG. 5, the display panel according to some embodiments of the disclosure can further include light-shielding layers 5 for shielding the ambient light from being incident on the photosensitive detecting elements 3, where the elastic light-reflecting components 4 can be located between the light-shielding layers 5, and the photosensitive faces of the photosensitive detecting elements 3, that is, the light-shielding layers 5 are located above the elastic light-reflecting components 4, and orthographical projection of the light-shielding layers 5 on the first substrate 1 cover the orthographical projections of the photosensitive detecting elements 3 on the first substrate 1. The light-shielding layers 5 in some embodiments of the disclosure can be light-shielding layers arranged to shield the ambient light from being incident on the photosensitive detecting elements 3, or can be the existing light-shielding components in the display panel. Since black matrixes are generally arranged in the existing display panel, and the black matrixes are also located at gaps between adjacent light-emitting elements, the light-shielding layers can be the black matrixes, so in some embodiments of the disclosure, the light-shielding layers are black matrixes so that light-shielding layers arranged to shield the ambient light from being incident on the photosensitive detecting elements can be dispensed with to thereby simplify a flow of fabricating the display panel.

In a particular implementation, the display panel according to some embodiments of the disclosure particularly can be an Organic Light-Emitting Diode (OLED) display panel, and more particularly can be a top- or bottom-emitting display panel to be described below by way of an example.

As illustrated in FIG. 1, for example, the display panel is a bottom-emitting display panel, where the elastic light-reflecting components 4 are arranged on the side of the first substrate 1 away from the light-emitting elements 2, that is, the first substrate 1 is located between the light-emitting elements 2 and the elastic light-reflecting components 4, and the light exit faces of the light-emitting elements 2 face the first substrate 1. Stated otherwise, the light of the display panel exits above in FIG. 1, the light-emitting elements 2 are located below the first substrate 1, and the elastic light-reflecting components 4 are located below the first substrate 1 on the side thereof proximate to a display face. Optionally, the first substrate 1 can be a flexible substrate. The photosensitive detecting elements 3 are located on the same side of the first substrate 1 as the light-emitting elements 2, i.e., below the first substrate 1.

Figure 6:
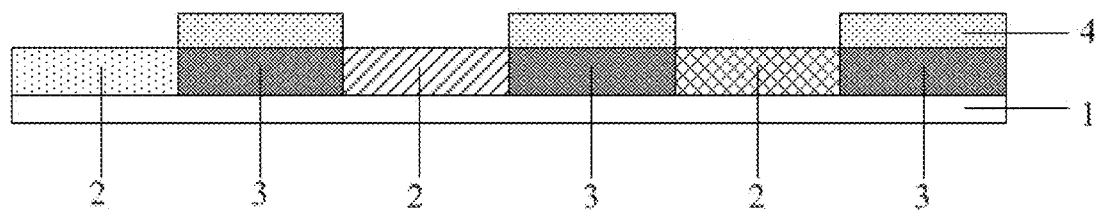
FIG. 6 is a schematic structural diagram of a top-emitting display panel according to an embodiment of the disclosure.

In another example, as illustrated in FIG. 6, the display panel is a top-emitting display panel, the light-emitting elements 2 and the elastic light-reflecting components 4 are located on the same side of the first substrate 1, and the light exit sides of the light-emitting elements 2 are away from the elastic light-reflecting components 4, that is, both the light-emitting elements 2 and the elastic light-reflecting components 4 are located above the first substrate 1, and the elastic light-reflecting components 4 are located on the sides of the light-emitting elements 2 facing a display face. The photosensitive detecting elements 3 are located on the same side of the first substrate 1 as the light-emitting elements 2, that is, the photosensitive detecting elements 3 are located between the first substrate 1 and the elastic light-reflecting components 4. Alike the first substrate 1 can be a flexible substrate.

Figure 7:
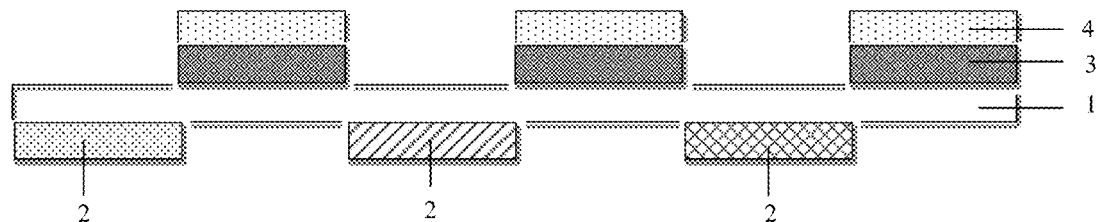
FIG. 7 is a schematic structural diagram of another display panel according to an embodiment of the disclosure.

In a particular implementation, as illustrated in FIG. 1, one photosensitive detecting element 3 can be arranged between every two adjacent light-emitting elements 2, that is, the photosensitive detecting elements 3 are arranged corresponding to the light-emitting elements 2 in a one-to-one manner, and for example, the photosensitive detecting elements 3 are arranged in an array, and one photosensitive detecting element 3 are arranged at an interval of every two adjacent light-emitting elements 2 in a row of light-emitting elements 2, so that the display panel can be provided with higher precision of pressure detection. Of course, in a particular implementation, a correspondence relationship between the photosensitive detecting elements 3 and the light-emitting elements 2 can alternatively be determined according to the precision of pressure detection as needed in reality, and for example, one photosensitive detecting element 3 can be arranged at an interval of every other three or more light-emitting elements 2. Further, the photosensitive detecting elements 3 and the light-emitting elements 2 may be arranged at a same layer, as illustrated in FIG. 5 and FIG. 6, that is, the photosensitive detecting elements 3 and the light-emitting elements 2 may be formed simultaneously. Alternatively, the photosensitive detecting elements 3 and the light-emitting elements 2 may be arranged at different layers, as illustrated in FIG. 7.

Figure 8:
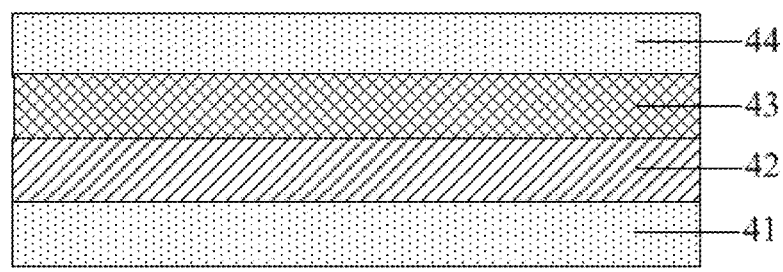
FIG. 8 is a schematic structural diagram of a photosensitive detecting element according to an embodiment of the disclosure.

In a particular implementation, as illustrated in FIG. 8, each photosensitive detecting element 3 in some embodiments of the disclosure particularly include an anode 41, a donor layer 42, an acceptor layer 43, and a cathode 44 arranged in a stack, where a light absorption band of the donor layer 43 and/or the acceptor layer 43 is the same as a light emission band of the light-emitting element 2 of the pixel element. In a particular display panel, the respective light-emitting elements 2 may emit light in different colors, and for example, some light-emitting elements 2 emit red light, some light-emitting elements 2 emit blue light, and some light-emitting elements 2 emit green light, and the same type of material may absorb the light in the different colors differently, so in some embodiments of the disclosure, the a light absorption band of the donor layer 43 and/or the acceptor layer 43 of the photosensitive detecting element 3 is set the same as the light emission band of the light-emitting element 2 of the pixel element, that is, although the respective light-emitting elements 2 may emit the light in different bands, the light absorption bands of the photosensitive detecting elements 3 are set as the light absorption bands of the light-emitting elements 2 so that the respective photosensitive detecting elements 3 can absorb the largest amount of light to thereby improve the detection sensitivity of the photosensitive detecting elements 3. Furthermore the material of the donor layer 43 and/or the acceptor layer 43 can be further selected so that there is the same intensity of electric signals generated by the respective photosensitive detecting elements 3 as a result of conversion given a pressure, thus avoiding detection of the pressure from being affected due to different materials of the photosensitive detecting elements 3.

Optionally, the photosensitive detecting elements 3 can be Organic Photosensitive Diodes (OPDs) which are diode elements made of an organic photosensitive material, and capable of outputting current adjusted according to an intensity of incident light.

Optionally, general parameters for evaluating the performance of an organic photosensitive diode include a light to dark current ratio, an External Quantum Efficiency (EQE), an optical responsivity R, a bandwidth, a specific detectivity D, etc., where the light to dark current ratio, also referred to a signal to noise ratio, refers to the ratio of current in the element on which light is incident, to current in the element on which no light is incident, i.e., Iph/Id; when photons are incident on the surface of the photosensitive element, the photosensitive material may be excited by a part of the photons to produce pairs of electrons and holes, thus resulting in current, and at this time, the number of produced electrons to the total number of incident photons is referred to as the external quantum efficiency; the bandwidth which is a cutoff frequency f-3 dB refers to the frequency of a corresponding input signal when the amplitude drops so that the ratio thereof to the maximum is $\sqrt{2}/2$; the optical responsivity refers to the ratio of the magnitude Iph of output light current in the element on which light is incident to the power Pout of an input light signal, i.e., R=Iph/Pout; and the specific detectivity refers to a spectrum detectivity of the organic photosensitive diode in a unit of area in a unit of bandwidth, and is a comprehensive index in Jones taking into account both the optical responsivity and the dark current, where the index can be defined in the equation of:

$$D = \frac{R}{\sqrt{2qJdark}}.$$

where Jdark refers to the density of dark current, and q represents an elementary charge.

As per the characteristics above of the organic photosensitive diode, in some embodiments of the disclosure, the elastic light-reflecting component are arranged on the first substrate to reflect the light emitted by the OLEDs so that the organic photosensitive diodes are closed to thereby trigger corresponding sensors into operation.

Figure 9:
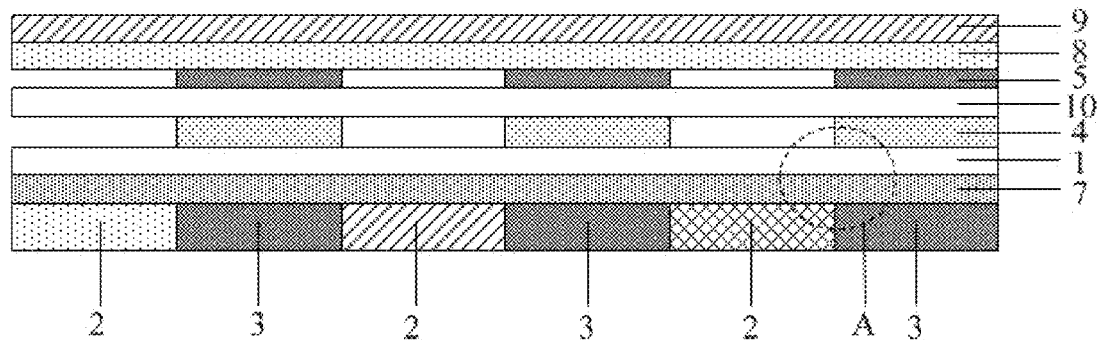
FIG. 9 is a schematic structural diagram of a particular display panel according to an embodiment of the disclosure.

In a particular implementation, as illustrated in FIG. 9, the display panel according to some embodiments of the disclosure particularly further includes a second substrate 10 opposite to the first substrate, where the light-shielding layers 5 can be located on the side of the second substrate 10 away from the elastic light-reflecting components. More the display panel can further include a circularly polarizing sheet 9 located on the sides of the light-shielding layers 5 away from the second substrate 10, where the circularly polarizing sheet 9 is fit on the light-shielding layers 5 through an optical adhesive layer 8, that is, the light-shielding layers 5, the optical adhesive layer 8, and the circularly polarizing sheet 9 are arranged on the side of the second substrate 10 away from the first substrate 1 in that order. Optionally, a thin film transistor layer 7 for driving the light-emitting elements 2 to emit light can be further arranged between the first substrate 1 and the light-emitting elements 2. In a particular fabrication flow, firstly the thin film transistor layer 7 can be formed on one side of the first substrate in a mask process, then the light-emitting elements 2 and the photosensitive detecting elements 3 can be formed in a mask process, then the elastic light-reflecting components 4 can be formed on the other side of the first substrate 1, then the second substrate 10 can be adhered on the side of the first substrate 1 arranged with the elastic light-reflecting components 4, then the light-shielding layers 5 can be formed on the side of the second substrate 10 away from the elastic light-reflecting components 4, and then the circularly polarizing sheet 9 can be adhered on the sides of the light-shielding layers 5 away from the second substrate 10 through the optical adhesive layer 8.

Figure 10:
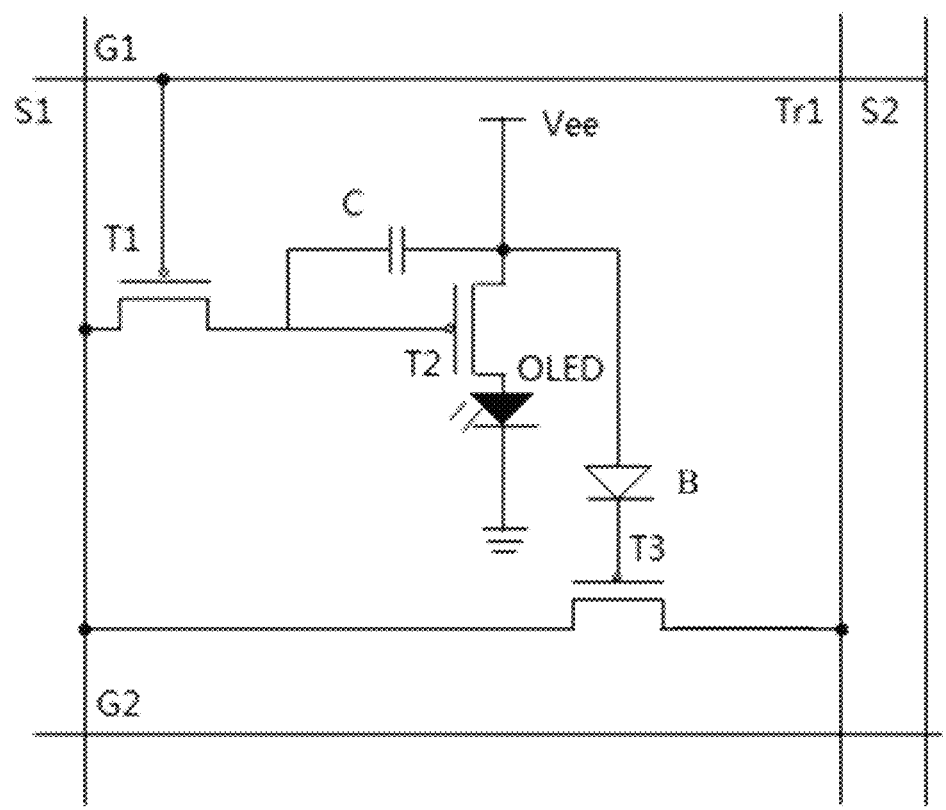
FIG. 10 is a schematic structural diagram of a pixel circuit according to an embodiment of the disclosure.

In a particular implementation, as illustrated in FIG. 10, in some embodiments of the disclosure, a light-emitting element 2 and a photosensitive detecting element 3 particularly can share the same pixel driving circuit including: a first transistor T1, a second transistor T2, and a third transistor T3, where the first transistor T1 has a gate connected with a gate line G1, a first electrode connected with a data line S1, and a second electrode connected with a gate of the second transistor T2; the second transistor T2 has a first electrode connected with a power supply terminal Vee, and a second electrode connected with the light-emitting element OLED, and the other terminal of the light-emitting element OLED particularly can be grounded; the photosensitive detecting element B has an anode connected with the power supply terminal Vee, and a cathode connected with a gate of the third transistor T3, i.e., the first electrode of the second transistor T2; and the third transistor T3 has a first electrode connected with the data line S1 (the same data line connected with the first transistor T1 of the pixel driving circuit), and a second electrode connected with an output signal terminal (which particularly can be a signal output line Tr1). In some embodiments of the disclosure, the light-emitting element 2 and the photosensitive detecting element 3 can share the same pixel driving circuit to thereby simplify wiring in the display panel, and lower the complexity of fabricating the display panel. Furthermore the third transistor T3 is arranged between the photosensitive detecting element 3 and the output signal terminal, and the first electrode of the third transistor T3 is connected with the data line S1, so a detected pressing signal can be further output when there is a touch, and the photosensitive detecting element 3 can detect the pressure in synchronization with the light-emitting element 2 emitting the light, to thereby avoid the photosensitive detecting element 3 from keeping on detecting a touch while the light-emitting element 2 is not emitting any light, which would otherwise shorten the lifetime of the photosensitive detecting element 3, where the first transistor T1 can be a switch transistor, and the second transistor T2 can be a driving transistor; and both of them can operate in the same way as a switch transistor and a driving transistor in a pixel driving circuit of an OLED in the related art. Moreover as illustrated in FIG. 10, a capacitor C can be further connected between the source supply terminal Vee, and the gate of the second transistor T2.

Figure 11:
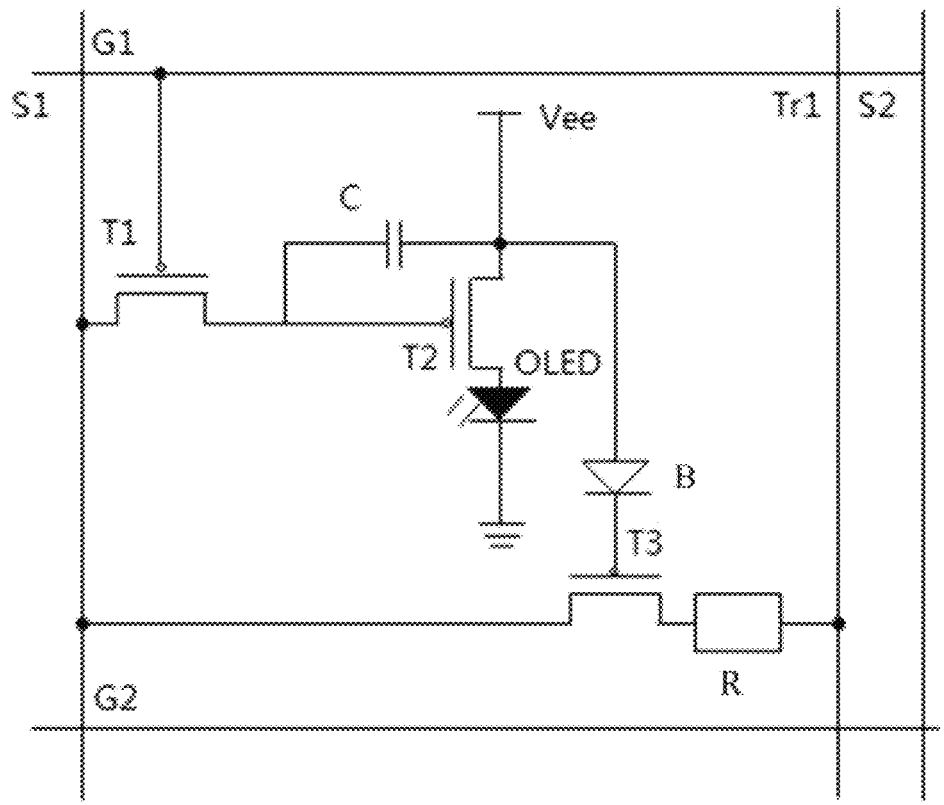
FIG. 11 is a schematic structural diagram of a particular pixel circuit according to an embodiment of the disclosure.

In a particular implementation, as illustrated in FIG. 11, a resistor R can be further connected between the second electrode of the third transistor T3, and the output signal terminal, so that the signal output from the third transistor T3 can be converted into a signal suitable for processing by a logic processing chip in the display panel.

Based upon the same inventive idea, an embodiment of the disclosure further provides a display device including the display panel according to some embodiments of the disclosure.

Figure 12:
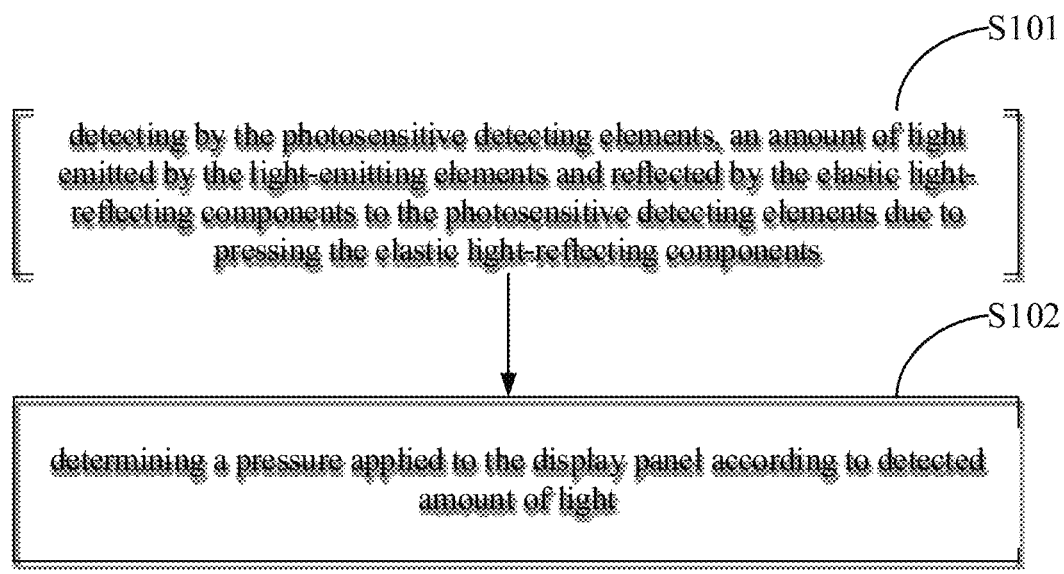
FIG. 12 is a schematic flow chart of a pressure detecting method according to an embodiment of the disclosure.

Based upon the same inventive idea, as illustrated in FIG. 12, an embodiment of the disclosure further provides a pressure detecting method for detecting a pressure on the display panel according to some embodiments of the disclosure upon being pressed, where the pressure detecting method includes the following steps:

the step S101 is to detect by the photosensitive detecting element, the amount of light emitted by the light-emitting element and reflected by the elastic light-reflecting component to the photosensitive detecting element due to pressing the elastic light-reflecting component; and the step S102 is to determine the pressure applied to the display panel according to detected amount of light.

Advantageous effects of the embodiments of the disclosure are as follows: a first substrate, a plurality of light-emitting elements located on one side of the first substrate, a plurality of photosensitive detecting elements 3 arranged between the corresponding light-emitting elements, and elastic light-reflecting components arranged corresponding to photosensitive faces of the photosensitive detecting elements, where light exit faces of the light-emitting elements, and the photosensitive faces of the photosensitive detecting elements face the same side of the display panel; and the elastic light-reflecting components can be pressed and deformed so that the areas of orthographical projections thereof on the first substrate become larger to thereby change the amount of light emitted by the light-emitting elements, and reflected by the elastic light-reflecting components to the photosensitive detecting elements, so the elastic light-reflecting components can reflect the light emitted by the light-emitting elements adjacent thereto upon being pressed, and the reflected light can be detected by the photosensitive detecting elements to thereby detect the pressure by detecting an optical signal so as to avoid the problem in the prior art if a 3D touch screen panel is fabricated using a capacitive pressure sensor, then a real change in touch capacitance of the touch panel may be easily affected, thus degrading the detection sensitivity of the touch panel.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A display panel, comprising: a first substrate, a plurality of light-emitting elements spaced with each other on one side of the first substrate, a plurality of photosensitive detecting elements, and elastic light-reflecting components arranged on a light-emitting side of the light-emitting elements, wherein:

an orthographical projection of the photosensitive detecting elements on the first substrate is located in an orthographical projection of the light-emitting elements on the first substrate; and the elastic light-reflecting components is configured to be deformed by pressing so that areas of orthographical projection thereof on the first substrate become larger to thereby change an amount of light emitted by the light-emitting elements and reflected by the elastic light-reflecting components to the photosensitive detecting elements.

2. The display panel according to claim 1, wherein the orthographical projection of the elastic light-reflecting components on the first substrate covers the orthographical projection of the light-emitting elements on the first substrate, upon the elastic light-reflecting components being deformed by pressing.

3. The display panel according to claim 1, wherein the elastic light-reflecting components comprises an elastic body, and reflecting particles dispersed in the elastic body, and the reflecting particles are configured to totally reflect the light incident on the elastic light-reflecting component.

4. The display panel according to claim 3, wherein a material of the elastic body is dimethylsiloxane.

5. The display panel according to claim 3, wherein a material of the reflecting particles is titanium dioxide.

6. The display panel according to claim 1, wherein surfaces of the elastic light-reflecting components facing the photosensitive detecting elements are concave-convex surfaces.

7. The display panel according to claim 1, further comprising gaps arranged between adjacent elastic light-reflecting components.

8. The display panel according to claim 7, further comprising light-shielding layers, and the elastic light-reflecting components are located between the light-shielding layers and the photosensitive detecting elements, and an orthographical projection of the light-shielding layers on the first substrate cover the orthographical projection of the photosensitive detecting elements on the first substrate.

9. The display panel according to claim 8, wherein the light-shielding layers are black matrixes.

10. The display panel according to claim 8, further comprising a second substrate opposite to the first substrate, and the light-shielding layers are located on a side of the second substrate away from the elastic light-reflecting components.

11. The display panel according to claim 1, further comprising a circularly polarizing sheet located on a side of the light-shielding layers away from the second substrate, and the circularly polarizing sheet is fit on the light-shielding layers through an optical adhesive layer.

12. The display panel according to claim 1, wherein the elastic light-reflecting components are arranged on a side of the first substrate away from the light-emitting elements, and light exit faces of the light-emitting elements face the first substrate.

13. The display panel according to claim 1, wherein the light-emitting elements and the elastic light-reflecting components are arranged on a same side of the first substrate, and light exit faces of the light-emitting elements are away from the first substrate.

14. The display panel according to claim 1, wherein the photosensitive detecting elements comprise an anode, a donor layer, an acceptor layer, and a cathode arranged in a stack, and a light absorption band of the donor layer and/or the acceptor layer is identical to a light emission band of the light-emitting element of a pixel element.

15. The display panel according to claim 1, wherein the light-emitting elements and the photosensitive detecting elements share a same pixel driving circuit; wherein the pixel driving circuit comprises a first transistor, a second transistor, and a third transistor, wherein the first transistor has a gate connected with a gate line, a first electrode connected with a data line, and a second electrode connected with a gate of the second transistor; the second transistor has a first electrode connected with a power supply terminal, and a second electrode connected with one terminal of the light-emitting elements, and the other terminal of the light-emitting elements is grounded; the photosensitive detecting elements have an anode connected with the power supply terminal, and a cathode connected with a gate of the third transistor.

16. The display panel according to claim 15, wherein a resistor is connected between a second electrode of the third transistor, and an output signal terminal.

17. The display panel according to claim 1, wherein the photosensitive detecting elements and the light-emitting elements are arranged at one same layer.

18. A display device, comprising the display panel according to claim 1.

19. A pressure detecting method, applied to the display panel according to claim 1, the method comprising:
  detecting by the photosensitive detecting elements, an amount of light emitted by the light-emitting elements and reflected by the elastic light-reflecting components to the photosensitive detecting elements due to pressing the elastic light-reflecting components; and
  determining a pressure applied to the display panel according to detected amount of light.

* * * * *